United States Patent
Aggarwal et al.

(10) Patent No.: US 8,645,779 B2
(45) Date of Patent: Feb. 4, 2014

(54) SCAN TESTING OF INTEGRATED CIRCUITS AND ON-CHIP MODULES

(75) Inventors: Rajan Aggarwal, New Delhi (IN); Ashutosh Anand, Bangalore (IN); Ankit Bhargava, Delhi (IN); Mishika Singla, Patiala (IN); Prashant K. Sonone, Akola (IN)

(73) Assignee: Freescale Semiconductor, Inc., Austin, TX (US)

(*) Notice: Subject to any disclaimer, the term of this patent is extended or adjusted under 35 U.S.C. 154(b) by 0 days.

(21) Appl. No.: 13/530,081

(22) Filed: Jun. 21, 2012

(65) Prior Publication Data
US 2013/0346819 A1    Dec. 26, 2013

(51) Int. Cl.
*G01R 31/28* (2006.01)
(52) U.S. Cl.
USPC .............. 714/729; 714/30; 714/726; 714/727
(58) Field of Classification Search
None
See application file for complete search history.

(56) References Cited

U.S. PATENT DOCUMENTS

| | | | |
|---|---|---|---|
| 5,802,075 A * | 9/1998 | Carpenter et al. | 714/738 |
| 6,079,040 A * | 6/2000 | Hom et al. | 714/738 |
| 6,615,380 B1 * | 9/2003 | Kapur et al. | 714/738 |
| 6,651,198 B1 | 11/2003 | Wang | |
| 7,246,282 B2 | 7/2007 | Chau | |
| 7,657,809 B1 | 2/2010 | Bhatia | |
| 7,657,854 B2 | 2/2010 | Goel | |
| 7,707,022 B2 | 4/2010 | O'Brien | |
| 2004/0128596 A1 * | 7/2004 | Menon et al. | 714/724 |
| 2005/0065747 A1 * | 3/2005 | Premy et al. | 702/120 |
| 2010/0179784 A1 * | 7/2010 | Crosby et al. | 702/117 |
| 2012/0317454 A1 * | 12/2012 | Krenz-Baath et al. | 714/739 |

* cited by examiner

*Primary Examiner* — John Trimmings
(74) *Attorney, Agent, or Firm* — Charles Bergere

(57) ABSTRACT

A method for scan testing an integrated circuit that includes a plurality of on-chip logic modules includes configuring the integrated circuit for module level scan testing and chip level scan testing by way of an external automatic test pattern generator (ATPG) tool. The ATPG tool generates first and second sets of test patterns for module level and chip level scan testing of the integrated circuit. The ATPG tool generates the second set of test patterns by excluding the design faults which have already been targeted during the module level scan testing, from the first set of test patterns and reduces the overall time required for scan testing the integrated circuit.

17 Claims, 3 Drawing Sheets

SCAN TESTING OF INTEGRATED CIRCUITS AND ON-CHIP MODULES

BACKGROUND OF THE INVENTION

The present invention relates generally to testing of integrated circuits, and more particularly, to scan testing of integrated circuits.

Transition fault testing is an important test performed during the design phase of an integrated circuit to identify and locate signal transition faults. The test, also known as an at-speed test, is widely carried out at rated clock speed to test the response of an integrated circuit. At-speed tests can be performed as scan tests that involve selecting a scan path in the integrated circuit for testing. During a scan test, an input signal is provided to a pin in the scan path. The signal propagates through the scan path and a value of the signal is read at a destination pin in the scan path. The scan out value is examined to determine if the scan-in and scan-out pins are properly connected.

For scan testing, the integrated circuit is divided into a plurality of on-chip logic modules. Each on-chip module is further segmented into scan chains or paths. A scan path refers to a chain of digital logic elements (e.g., flip-flops, latches, and data registers) within an on-chip module. An external automatic test pattern generator (ATPG) tool is connected to the integrated circuit, which generates and ports test patterns to the integrated circuit. The ATPG tool specifies one of the on-chip modules for scan testing and tests each scan path therein (also referred to as module level scan testing). After each on-chip module is tested independently, the ATPG tool regenerates test patterns for testing scan paths within one or more of the on-chip modules together (also referred to as chip level scan testing).

Chip level scan testing is a tedious and time consuming task as the ATPG tool requires a considerable amount of time for generating new test patterns. For example, chip level scan testing of a system-on-chip (SoC) that includes about 500 million transistors requires more than 1000 processors to generate test patterns and around nine months to complete testing and verification. A typical design cycle of a SoC of the size described above is about two to three months. Therefore, completing the entire scan testing (module and chip level scan testing) within the span of the design cycle is often impossible and leads to design delays. Moreover, any failure during chip level scan testing requires about seven additional days for the ATPG tool to regenerate corresponding test patterns, which further adds to the test time. Thus, existing test tools and techniques introduce a significant delay in time-to-market (TTM) of an integrated circuit.

Therefore, there is a need for a way to reduce the time needed to generate scan test patterns in order to reduce the overall time required for scan testing an integrated circuit and that overcomes the above-mentioned limitations of existing scan test solutions.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements. It is to be understood that the drawings are not to scale and have been simplified for ease of understanding the invention.

DETAILED DESCRIPTION OF THE PRESENT INVENTION

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention. In the description, the term multiplexer has been abbreviated as mux.

In an embodiment of the present invention, a method for scan testing an integrated circuit using an external automated test pattern generator (ATPG) tool, is provided. The integrated circuit includes a plurality of on-chip logic modules, and each on-chip logic module includes a plurality of scan paths, each scan path includes a plurality of logic elements. The integrated circuit is configured for module level scan testing of each on-chip logic module independently. A first set of test patterns is generated by the ATPG tool for module level scan testing. The first set of test patterns correspond to a first set of design faults in the plurality of scan paths. The plurality of scan paths are tested using the first set of test patterns. Thereafter, the integrated circuit is configured for chip level scan testing of one or more on-chip modules together. A second set of test patterns is generated for chip level scan testing by the ATPG tool, by excluding the first set of design faults from the first set of test patterns and the plurality of scan paths are tested using the second set of test patterns.

Various embodiments of the present invention provide a method for scan testing an integrated circuit. The integrated circuit includes a plurality of on-chip logic modules, each on-chip logic module includes a plurality of scan paths, and each scan path includes a plurality of logic elements. An external automatic test pattern generator (ATPG) tool generates a first set of test patterns corresponding to a first set of design faults in the plurality of scan paths, for module level scan testing of each on-chip logic module independently and tests the plurality of scan paths using the first set of test patterns. Thereafter, the ATPG tool generates a second set of test patterns for chip level scan testing of one or more on-chip logic modules together and tests the plurality of scan paths using the second set of test patterns. The ATPG tool generates the second set of test patterns by excluding the first set of design faults from the first set of test patterns and targets only those design faults that have not been verified during the module level scan testing. Thus, the time required for generating test patterns is considerably reduced and the overall time required for scan testing the integrated circuit is reduced.

Figure 1:
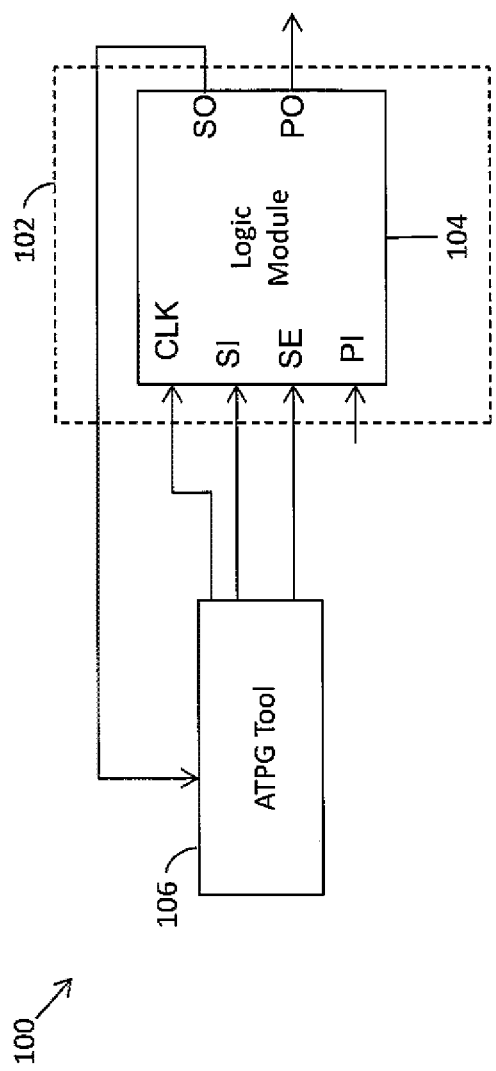
FIG. 1 is a schematic block diagram of a test system for scan testing an integrated circuit in accordance with an embodiment of the present invention.

Referring now to FIG. 1, a schematic block diagram of a test system 100 for scan testing an integrated circuit 102, in accordance with an embodiment of the present invention, is shown. The integrated circuit 102 may be a microprocessor, a microcontroller unit (MCU), a system-on-chip (SOC), or an application specific integrated circuit (ASIC) and includes a plurality of on-chip logic modules 104 (one of which is shown). Each on-chip logic module 104 is further segmented into scan chains or scan paths. A scan path refers to a chain of digital logic elements (e.g., flip-flops, latches, or data registers) within the on-chip logic modules 104. The test system 100 further includes an automatic test pattern generator (ATPG) tool 106 that is connected to the integrated circuit 102. The ATPG tool 106 generates first and second sets of test patterns for module and chip level scan testing, respectively, of the scan paths within the on-chip logic modules 104. The ATPG tool 106 may be any suitable commercially available pattern generation and verification tool, such as those developed commercially by Cadence, Inc., Synopsys, Inc., and Mentor Graphics, Inc.

Figure 2:
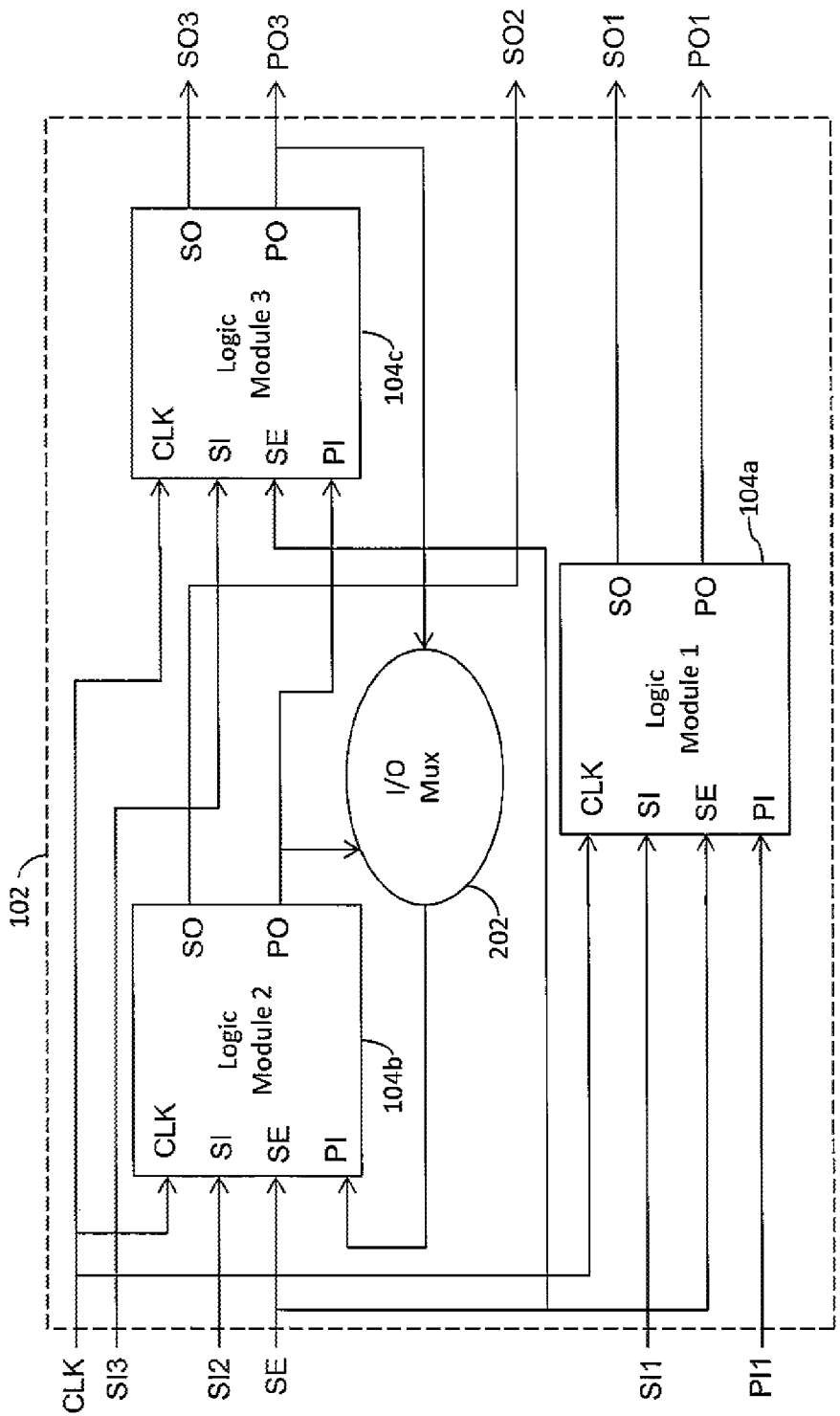
FIG. 2 is a detailed schematic block diagram of an integrated circuit that is being scan tested in accordance with an embodiment of the present invention.

FIG. 2 shows a detailed schematic block diagram of the integrated circuit 102 that is being scan tested, in accordance with an embodiment of the present invention. The integrated circuit 102 includes first through third on-chip logic modules 104a-104c (collectively referred to as on-chip logic modules 104). The integrated circuit 102 and the on-chip logic modules 104 each include clock input (CLK), scan input (SI), scan enable (SE), scan output (SO), primary input (PI) and primary output (PO) ports. SI and SO ports of the first through third on-chip logic modules 104a-104c can be accessed by way of corresponding SI ports (SI1-SI3) and SO ports (SO1-SO3) of the integrated circuit 102. The PI and PO ports of the first through third on-chip logic modules 104a-104c are interconnected by way of a plurality of input/output (I/O) muxes 202. The CLK and SE ports of the integrated circuit 102 are connected to the corresponding CLK and SE ports of the first through third on-chip logic modules 104a-104c.

In an exemplary implementation illustrated in FIG. 2, the PI and PO ports of the first on-chip logic module 104a are accessible by way of corresponding PI1 and PO1 ports of the integrated circuit 102. The PO port of the second on-chip logic module 104b is connected to the PI port thereof, by way of the I/O muxes 202 and further to the PI port of the third on-chip logic module 104c. The PO port of the third on-chip logic module 104c is accessible by way of the PO3 port of the integrated circuit 102 and is also connected to the PI port of the second on-chip logic module 104b, by way of the I/O muxes 202. It will be apparent to a skilled artisan that the connections between the PI and PO ports of the first through third on-chip logic modules 104a-104c and those of the integrated circuit 102 as shown in FIG. 2 are exemplary and numerous other combinations are possible and the present invention is applicable to all such combinations. For example, the integrated circuit 102 may include PI2 and PO2 ports for accessing corresponding PI and PO ports of the second on-chip logic module 104b and a PI3 port for accessing the PI port of the third on-chip logic module 104c, and so forth.

In operation, the ATPG tool 106 is connected to the integrated circuit 102 and configures the integrated circuit 102 for module level scan testing, in which, each on-chip logic module 104 is tested independently. For example, to scan test the first on-chip logic module 104a, the ATPG tool 106 access the CLK, SI, SE, SO, PI and PO ports of the first on-chip logic module 104a by way of the corresponding CLK, SI1, SE, SO1, PI1 and PO1 ports of the integrated circuit 102, and configures the first on-chip logic module 104a for module level scan testing. The PI and PO ports of the first on-chip logic module 104a are masked for module level scan testing. The on-chip logic module 104a further includes scan wrapper, scan compression and scan control circuits (not shown), which are configured by the ATPG tool 106 for module level scan testing. The scan wrapper circuit mitigates the effect of masking the PI and PO ports on the test process. The scan compression circuit reduces the volume of patterns generated by the ATPG tool 106 and aligns the test patterns with physical partitioning of the on-chip logic modules 104. The scan control circuit configures the on-chip logic modules 104 across different test configurations.

After the configuration is complete, the ATPG tool 106 generates a first set of test patterns that are targeted to verify design faults in scan paths of the first on-chip logic module 104a. The ATPG tool 106 asserts the SE port of the first on-chip logic module 104a and loads test values defined by the first set of test patterns in to logic elements of the scan paths therein, by way of the SI1 port and based on a clock signal provided at the CLK port of the first on-chip logic module 104a. Thereafter, the ATPG tool 106 de-asserts the SE port of the first on-chip logic module 104a and captures output values of the logic elements by way of the S01 port and based on the clock signal provided at the CLK port of the first on-chip logic module 104a. The output values are compared with desired specifications to detect faults in the scan paths. The second and third on-chip logic modules 104b and 104c are scan tested in a similar manner.

After completion of the module level scan testing, the ATPG tool 106 configures the integrated circuit 102 for chip level scan testing. Chip level scan testing involves verifying scan paths across multiple on-chip logic modules 104 to detect design faults therein. In an example, for chip level scan testing of the first through third on-chip logic modules 104a-104c, the ATPG tool 106 is connected to the CLK, SI1-SI3, SE, SO1-SO3, PI1, PO1 and P03 ports of the integrated circuit 102. The SI1-SI3 ports are mapped with corresponding SI ports of the on-chip logic modules 104 and the SO1-SO3 ports are mapped with corresponding SO ports of the on-chip logic modules 104. The SE port of the integrated circuit 102 is synchronized with the SE ports of the on-chip logic modules 104. Similarly, the PI1, PO1 and P03 ports of the integrated circuit 102 are synchronized with the PI and PO ports of the on-chip logic modules 104, by way of the I/O muxes 202. The CLK ports of the on-chip logic modules 104 are configured to receive the clock signal by way of the CLK port of the integrated circuit 102.

After the configuration is complete, the ATPG tool 106 modifies the first set of test patterns to exclude design faults that are already targeted during module level scan testing and generates a second set of test patterns to target the remaining design faults. In various embodiments of the present invention, the ATPG tool 106 may use a suitable programming language such as structured query language (SQL) to modify the first set of test patterns and generate the second set of test patterns. Thereafter, the ATPG tool 106 scan tests the on-chip logic modules 104 by using the second set of test patterns. The ATPG tool 106 asserts the SE ports of the on-chip logic modules 104 and loads test values defined by the second set of test patterns in to the logic elements of the scan paths therein, by way of the SI1-SI3 ports and based on the clock signal provided at the CLK port of the integrated circuit 102. Thereafter, the ATPG tool 106 de-asserts the SE ports of the on-chip logic modules 104 and captures output values of the logic elements by way of the SO port of the integrated circuit 102 and based on the clock signal provided at CLK port of the integrated circuit 102. The output values are compared with desired specifications to detect faults in the scan paths. Thus, the ATPG tool 106 tests or verifies only those design faults that are not targeted during module level scan testing, which considerably reduces the testing and also reduces the overall time required for scan testing of the integrated circuit 102.

Figure 3:
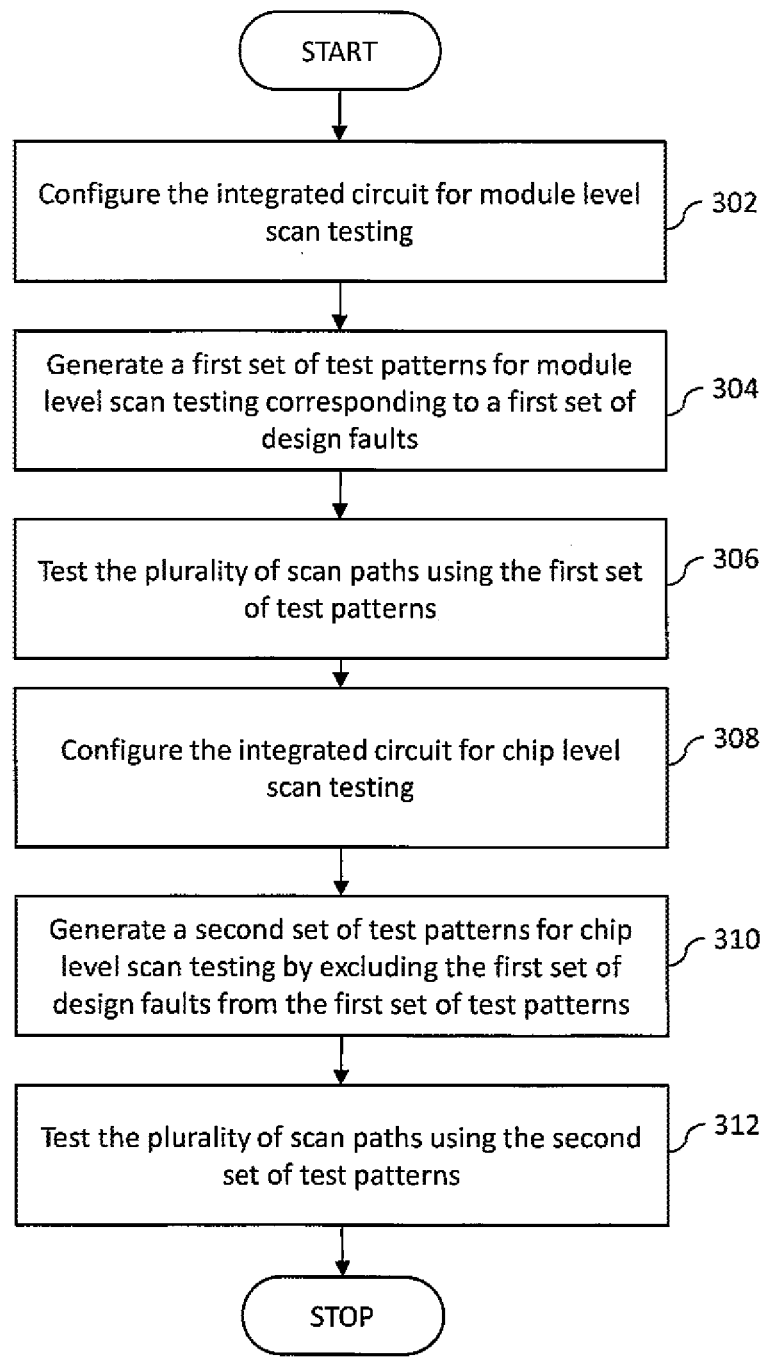
FIG. 3 is a flow chart illustrating a method for scan testing an integrated circuit in accordance with an embodiment of the present invention.

Referring now to FIG. 3, a flow chart illustrating a method for scan testing the integrated circuit 102, in accordance with an embodiment of the present invention, is shown. Steps of the method for scan testing the integrated circuit 102 are executed by the external ATPG tool 106, and have been explained in conjunction with FIG. 2. At step 302, the ATPG tool 106 configures the integrated circuit 102 for module level scan testing, in which each on-chip logic module 104 is tested independently. For example, to scan test the first on-chip logic module 104*a*, the ATPG tool 106 is connected to the CLK, SI, SE, SO, PI and PO ports of the first on-chip logic module 104*a* by way of the corresponding CLK, SI1, SE, SO1, PI1 and PO1 ports of the integrated circuit 102 and configures the first on-chip logic module 104*a* for module level scan testing. At step 304, the ATPG tool 106 generates a first set of test patterns that are targeted to verify design faults in scan paths of the first on-chip logic module 104*a*. At step 306, the ATPG tool 106 tests the scan paths within the first on-chip logic module 104*a* by using the first set of test patterns, the process for which has already been described in conjunction with FIG. 2. Scan paths within second and third on-chip logic modules 104*b* and 104*c* are tested in a similar manner.

At step 308, the ATPG tool 106 configures the integrated circuit 102 for chip level scan testing, in which, scan paths across multiple on-chip logic modules 104 are verified for design faults. For scan testing the first through third on-chip logic modules 104*a*-104*c* at chip level, the ATPG tool 106 is connected to the CLK, SI1-SI3, SE, SO1-SO3, PI1, PO1 and PO3 ports of the integrated circuit 102. At step 310, the ATPG tool 106 generates a second set of test patterns for chip level scan testing by modifying the first set of test patterns to exclude design faults that are targeted during module level scan testing. At step 312, the ATPG tool 106 tests scan paths within the on-chip logic modules 104 by using the second set of test patterns, the process for which has already been described in conjunction with FIG. 2.

In an exemplary embodiment, the method of the present invention requires about forty-five days and 360 processors for chip leveling scan testing of a system-on-chip (SoC) that has about 500 million transistors, as opposed to nine months and 1080 processors required for chip level scan testing of the same SoC by using conventional test methods.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A method for scan testing an integrated circuit including a plurality of on-chip logic modules, using an external automated test pattern generator (ATPG) tool, wherein each on-chip logic module includes a plurality of scan paths and each scan path includes a plurality of logic elements, the method comprising:
configuring the integrated circuit for module level scan testing, wherein each on-chip logic module is tested independently;
generating a first set of test patterns for module level scan testing by the external ATPG tool, wherein the first set of test patterns corresponds to a first set of design faults in the plurality of scan paths;
testing the plurality of scan paths using the first set of test patterns;
configuring the integrated circuit for chip level scan testing of one or more on-chip modules together, including synchronizing functional primary input and output ports of the integrated circuit and corresponding primary input and output ports of the plurality of on-chip logic modules;
generating a second set of test patterns for chip level scan testing by the external ATPG tool, based on the first set of test patterns; and
testing the plurality of scan paths-using the second set of test patterns.

2. The method of claim 1, wherein the second set of test patterns is generated by the external ATPG tool excluding the first set of design faults from the first set of test patterns.

3. The method of claim 1, wherein configuring the integrated circuit for module level scan testing comprises masking the functional primary input and output ports of each on-chip logic module.

4. The method of claim 1, wherein configuring the integrated circuit for module level scan testing comprises configuring scan wrapper, scan compression and scan control circuits associated with each on-chip logic module.

5. The method of claim 1, wherein configuring the integrated circuit for chip level scan testing comprises mapping clock signals, scan channels and scan ports of the integrated circuit with corresponding clock signals, scan channels and scan ports of the plurality of on-chip logic modules.

6. The method of claim 1, wherein testing the plurality of scan paths using the first set of test patterns comprises:
asserting a scan enable (SE) port of an on-chip logic module;
loading test values defined by the first set of test patterns into corresponding logic elements of the scan paths within the on-chip logic module, by way of a scan input (SI) port of the on-chip logic module;
de-asserting the SE port of the on-chip logic module; and
capturing output values of the logic elements at a scan output (SO) port of the on-chip logic module.

7. The method of claim 6, further comprising observing the output values at at least one of the primary input and output ports of the on-chip logic module.

8. The method of claim 1, wherein testing the plurality of scan paths using the second set of test patterns comprises:
selecting a first set of on-chip logic modules by way of a scan enable (SE) port of the integrated circuit;
loading test values defined by the second set of test patterns into corresponding logic elements of the scan paths within the first set of on-chip logic modules using a scan input (SI) port of the integrated circuit;
de-asserting the SE port of the integrated circuit; and
capturing output values of the logic elements by way of corresponding scan output (SO) ports of the integrated circuit.

9. The method of claim 8, further comprising observing the output values at at least one of a primary input and an output port of the integrated circuit.

10. An automated test pattern generator (ATPG) tool including at least one processor and at least one memory in communication with the processor, wherein the memory is used to store an integrated circuit design of an integrated circuit having a plurality of on-chip logic modules, and wherein each on-chip logic module includes a plurality of scan paths and each scan path includes a plurality of logic elements, the ATPG tool for scan testing the integrated circuit by performing steps including:
configuring the integrated circuit for module level scan testing wherein each on-chip logic module is tested independently;

generating a first set of test patterns for the module level scan testing, wherein the first set of test patterns corresponds to a first set of design faults in the plurality of scan paths;

testing the plurality of scan paths using the first set of test patterns;

configuring the integrated circuit for chip level scan testing of one or more of the on-chip modules together, including synchronizing functional primary input and output ports of the integrated circuit and the plurality of on-chip logic modules;

generating a second set of test patterns for the chip level scan testing, wherein the second set of test patterns excludes the first set of design faults of the first set of test patterns; and testing the plurality of scan paths using the second set of test patterns.

11. The ATPG tool of claim 10, wherein configuring the integrated circuit for module level scan testing comprises masking the functional primary input and output ports of each on-chip logic module.

12. The ATPG tool of claim 10, wherein configuring the integrated circuit for module level scan testing further comprises configuring scan wrapper, scan compression and scan control circuits associated with each on-chip logic module.

13. The ATPG tool of claim 10, wherein configuring the integrated circuit for chip level scan testing further comprises mapping clock signals, scan channels and scan ports of the integrated circuit with corresponding clock signals, scan channels and scan ports of the plurality of on-chip logic modules.

14. The ATPG tool of claim 10, wherein testing the plurality of scan paths using the first set of test patterns comprises:
    asserting a scan enable (SE) port of an on-chip logic module;
    loading test values defined by the first set of test patterns into corresponding logic elements of the scan paths within the on-chip logic module, by way of a scan input (SI) port of the on-chip logic module;
    de-asserting the SE port of the on-chip logic module; and
    capturing output values of the logic elements at a scan output (SO) port of the on-chip logic module.

15. The ATPG tool of claim 14, further comprising observing the output values at at least one of a primary input and a primary output port of the on-chip logic module.

16. The ATPG tool of claim 10, wherein testing the plurality of scan paths using the second set of test patterns comprises:
    selecting a first set of on-chip logic modules, by way of a scan enable (SE) port of the integrated circuit;
    loading test values defined by the second set of test patterns into corresponding logic elements of the scan paths within the first set of on-chip logic modules, by way of corresponding scan input (SI) ports of the integrated circuit;
    de-asserting the SE port of the integrated circuit; and
    capturing output values of the logic elements at corresponding scan output (SO) ports of the integrated circuit.

17. The ATPG tool of claim 16, further comprising observing the output values at at least one of primary input and output ports of the integrated circuit.

* * * * *